(12) United States Patent
Lii

(10) Patent No.: US 9,659,935 B2
(45) Date of Patent: May 23, 2017

(54) DIELECTRIC LINER ADDED AFTER CONTACT ETCH BEFORE SILICIDE FORMATION

(71) Applicant: Texas Instruments Incorporated, Dallas, TX (US)

(72) Inventor: Tom Lii, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 6 days.

(21) Appl. No.: 14/745,793

(22) Filed: Jun. 22, 2015

(65) Prior Publication Data

US 2015/0287723 A1 Oct. 8, 2015

Related U.S. Application Data

(62) Division of application No. 13/910,801, filed on Jun. 5, 2013, now Pat. No. 9,093,380.

(51) Int. Cl.
| | |
|---|---|
| H01L 29/66 | (2006.01) |
| H01L 27/092 | (2006.01) |
| H01L 21/285 | (2006.01) |
| H01L 21/768 | (2006.01) |
| H01L 29/423 | (2006.01) |
| H01L 29/45 | (2006.01) |
| H01L 29/49 | (2006.01) |

(Continued)

(52) U.S. Cl.
CPC ...... *H01L 27/092* (2013.01); *H01L 21/28518* (2013.01); *H01L 21/76831* (2013.01); *H01L 21/76838* (2013.01); *H01L 21/823871* (2013.01); *H01L 29/42364* (2013.01); *H01L 29/45* (2013.01); *H01L 29/4975* (2013.01); *H01L 29/4983* (2013.01); *H01L 29/51* (2013.01); *H01L 29/518* (2013.01); *H01L 21/76814* (2013.01); *H01L 21/76843* (2013.01); *H01L 21/76855* (2013.01); *H01L 21/823814* (2013.01)

(58) Field of Classification Search
CPC .......................... H01L 27/092; H01L 29/665
USPC .................................. 438/596; 257/382–384
See application file for complete search history.

(56) References Cited

U.S. PATENT DOCUMENTS

| | | | |
|---|---|---|---|
| 5,801,097 A | 9/1998 | Chang | |
| 7,214,990 B1 * | 5/2007 | Lee | H01L 27/016 257/368 |

(Continued)

*Primary Examiner* — Mark Prenty
(74) *Attorney, Agent, or Firm* — Jacqueline J. Garner; Charles A. Brill; Frank D. Cimino

(57) ABSTRACT

A method for forming MOS transistor includes providing a substrate including a semiconductor surface having a gate electrode on a gate dielectric thereon, dielectric spacers on sidewalls of the gate electrode, a source and drain in the semiconductor surface on opposing sides of the gate electrode, and a pre-metal dielectric (PMD) layer over the gate electrode and over the source and drain regions. Contact holes are formed through the PMD layer to form a contact to the gate electrode and contacts to the source and drain. A post contact etch dielectric layer is then deposited on the contacts to source and drain and on sidewalls of the PMD layer. The post contact etch dielectric layer is selectively removed from the contacts to leave a dielectric liner on sidewalls of the PMD layer. A metal silicide layer is formed on the contacts to the source and drain.

17 Claims, 6 Drawing Sheets

(51) Int. Cl.
*H01L 29/51* (2006.01)
*H01L 21/8238* (2006.01)

(56) References Cited

U.S. PATENT DOCUMENTS

| | | | |
|---|---|---|---|
| 7,745,320 B2 | 6/2010 | Ye et al. | |
| 8,298,875 B1 * | 10/2012 | Or-Bach | H01L 29/4236 |
| | | | 257/E21.411 |
| 9,093,380 B2 * | 7/2015 | Lii | H01L 21/28518 |
| 9,401,359 B2 * | 7/2016 | Jeong | H01L 21/76897 |
| 2004/0147110 A1 * | 7/2004 | Swanson | H01L 21/76816 |
| | | | 438/624 |
| 2004/0173856 A1 * | 9/2004 | Park | H01L 21/76829 |
| | | | 257/382 |
| 2008/0083955 A1 * | 4/2008 | Kanarsky | H01L 21/76829 |
| | | | 257/382 |
| 2008/0311711 A1 | 12/2008 | Hampp et al. | |
| 2009/0159932 A1 | 6/2009 | Pinto et al. | |
| 2009/0289306 A1 * | 11/2009 | Watanabe | H01L 21/823807 |
| | | | 257/369 |
| 2012/0292719 A1 | 11/2012 | Teh et al. | |
| 2013/0252416 A1 * | 9/2013 | Takeda | H01L 21/486 |
| | | | 438/630 |

* cited by examiner

DIELECTRIC LINER ADDED AFTER CONTACT ETCH BEFORE SILICIDE FORMATION

CROSS REFERENCE TO RELATED APPLICATIONS

This application is a divisional of U.S. Nonprovisional Patent Application Ser. No. 13/910,801, filed Jun. 5, 2013, the contents of which are herein incorporated by reference in its entirety.

FIELD

Disclosed embodiments relate generally to semiconductor fabrication, more particularly to fabrication of Complementary Metal-Oxide Semiconductor (CMOS) integrated circuits (ICs), and IC devices therefrom.

BACKGROUND

MOS transistors may include metal silicide contacts on the top semiconductor surface including on the source/drain regions and on the gate electrodes in the case of polysilicon to lower the contact resistance and thus improve device performance. Before forming the silicide contacts, contact (or via) holes are cut though one or more dielectric layers above semiconductor surface followed by a silicide pre-clean. The critical dimension (CD) of the contact holes should be large enough to avoid high resistance (or open) silicide contacts, yet small enough in size to avoid leakage (or shorting) that may result from the contact hole CDs being above a certain size (oversized CDs).

In an attempt to address this problem, the CD at the contact mask photolithography level may be patterned to provide a reduced CD to compensate for the contact CD size increase resulting from the silicide pre clean. However, photolithography and etch generally have a small process window to produce reduced CD contact holes reliably, which can result in printing failures that cause high resistance (or electrically open) contacts.

SUMMARY

Disclosed embodiments recognize for conventional silicide contact formation the dielectric thickness between contact hole and top corner of gate electrode can become small due to the enlarging of the contact critical dimension (CD) from etching during the silicide pre-cleaning step. The resulting thin dielectric between the contact hole (e.g., later the contact holes may be filled with tungsten) and top corner of gate electrode can breakdown under typical IC operating voltages (e.g., several volts) causing device failures and yield loss.

Disclosed embodiments solve the above problem by providing methods for forming metal oxide semiconductor (MOS) transistors including an added dielectric layer between contact etch and silicide formation which has been found to avoid the silicide pre-clean enlarging of the contact hole CDs, which is recognized to help avoid associated leakage (or shorting) between the gate and the source or drain. This added dielectric layer is referred to herein as a "post contact etch dielectric layer" which after selective removal from the bottom of the contacts while remaining on the sidewalls of the contact holes is referred to herein as a "dielectric liner".

The post contact etch dielectric layer/dielectric liner can comprise various dielectric layers such as silicon nitride (SiN), silicon oxynitride (SiON), silicon carbide (SiC), or silicon carbon nitride (SiCN). The post contact etch dielectric layer at bottom of contacts can be selectively removed by an Ar sputter etch (PSE) or reactive ion etch (RIE) before the silicide pre-clean. Disclosed dielectric liners protect the contact sidewall during silicide pre clean processing, which helps eliminate or at least largely reduce the contact CD increase due to silicide pre-clean processing, and thus improves the contact/gate electrode short process margin.

BRIEF DESCRIPTION OF THE DRAWINGS

Reference will now be made to the accompanying drawings, which are not necessarily drawn to scale, wherein.

DETAILED DESCRIPTION

Figure 1:
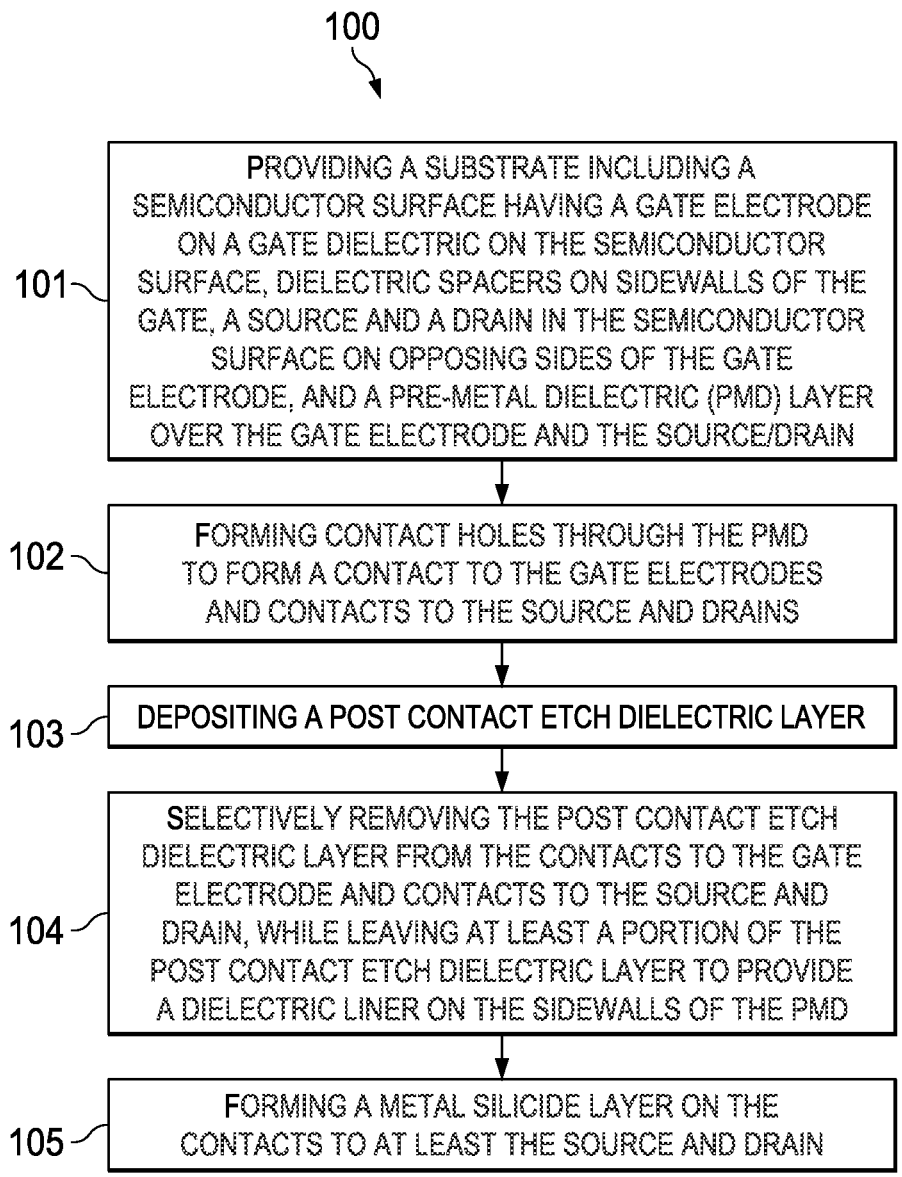
FIG. 1 is a flow chart that shows steps in an example method for forming MOS transistors including a dielectric liner added after contact etch before silicide, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming a MOS transistor including a dielectric liner added after contact etch and before silicide formation, according to an example embodiment. Step 101 comprises providing a substrate including a semiconductor surface having a gate electrode on a gate dielectric on the semiconductor surface, dielectric spacers on sidewalls of the gate electrode, source and drain in the semiconductor surface on opposing sides of the gate electrode, and a pre-metal dielectric (PMD) layer over the gate electrode and the source/drain. The substrate is generally provided in wafer form including a plurality (e.g., hundreds or thousands) of die.

The flow to form the substrate including a semiconductor surface with the various features provided in step 101 as known in the semiconductor fabrication arts is briefly described in a few paragraphs below. A gate dielectric may be formed on the semiconductor surface of the substrate, such as on an optional pwell or nwell formed in the semiconductor surface. The substrate at this point generally already has dielectric isolation regions, such as shallow trench isolation (STI). The gate dielectric layer can comprise materials such as silicon oxide, nitrogen doped silicon dioxide, silicon oxynitride, barium strontium titanate (BST), lead zirconate titanate (PZT), hafnium oxide or other Hi-k material, or any combination or stack thereof, such as being 1 to 3 nanometers thick. The gate electrode is then formed, such as comprised of polysilicon, later doped p-type for PMOS transistors and n-type for NMOS transistors with an optional silicide formed on top. Spacers are then formed on the gate sidewalls, such as comprised of an oxide, a nitride, an oxynitride or a combination or stack thereof, thereby creating an offset space adjacent to the gate stacks.

Lightly doped drains (LDDs) may be provided for both NMOS transistors and PMOS transistors. Regions of pocket dopant can be formed as LDDs. Source/drain spacers on the sidewalls of the gate electrode are then generally formed. The source/drain spacers can comprise an oxide/nitride stack, but alternatively can comprise an oxide, a nitride, an oxynitride, or any suitable material. Source and drain are then formed for PMOS transistors and NMOS transistors.

The source-drain formation step may also include typical process modifications to create embedded silicon germanium (SiGe) stressor regions in PMOS transistors and heavily doped silicon epi/embedded SiC stressor regions in the NMOS transistors. These embedded stressors in the source and drain regions impart stress to the transistor channel enhancing NMOS and PMOS transistors performance. An annealing step which may be referred to as a source/drain anneal generally follows, which can be preceded by a stress memorization layer (SMT) typically nitride/oxide deposition. During the annealing step the SMT transfers stress to the NMOS transistors in the die increasing their performance. The SMT layer is then removed. Alternatively, the source/drain spacers are removed after source-drain region formation for improving PMD gap fill.

The optional step of replacement gate processing can follow. The original gate electrodes, such as polysilicon gate electrodes, for at least one of the PMOS transistors and the NMOS transistors, can be removed following the source/drain anneal to form gate trenches using a suitable etch process. In a typical replacement gate flow for NMOS and PMOS transistors, the original gate electrodes (e.g., polysilicon) are removed as well as at least a portion of their gate dielectrics and a Hi-k dielectric layer is then deposited. As described above, the Hi-k dielectric may include an interface layer of silicon dioxide ($SiO_2$) grown/deposited on the surface of the substrate and/or a deposited layer of Hi-k dielectric such as hafnium oxide, hafnium silicon oxynitride, lanthanum oxide, zirconium oxide, and aluminum oxide. Subsequent steps in the replacement gate flow include PMOS barrier metal deposition, pattern and removal from NMOS regions followed by NMOS barrier metal deposition. The last steps in the replacement gate flow are gapfill with low resistance metal and chemical mechanical polishing (CMP) to isolate the NMOS metal gate electrode from the PMOS metal gate electrode.

The choice of barrier metal is based on work function considerations. The PMOS barrier metal may include one or more metals from the group of titanium nitride, tantalum nitride, aluminum, and platinum. The NMOS barrier metal may contain one or more metals from the group of titanium, aluminum, and tungsten. The low resistance gap fill metal usually comprises aluminum, titanium-aluminum or tungsten. The PMD layer is then blanket deposited, and then planarized.

Figure 2A:
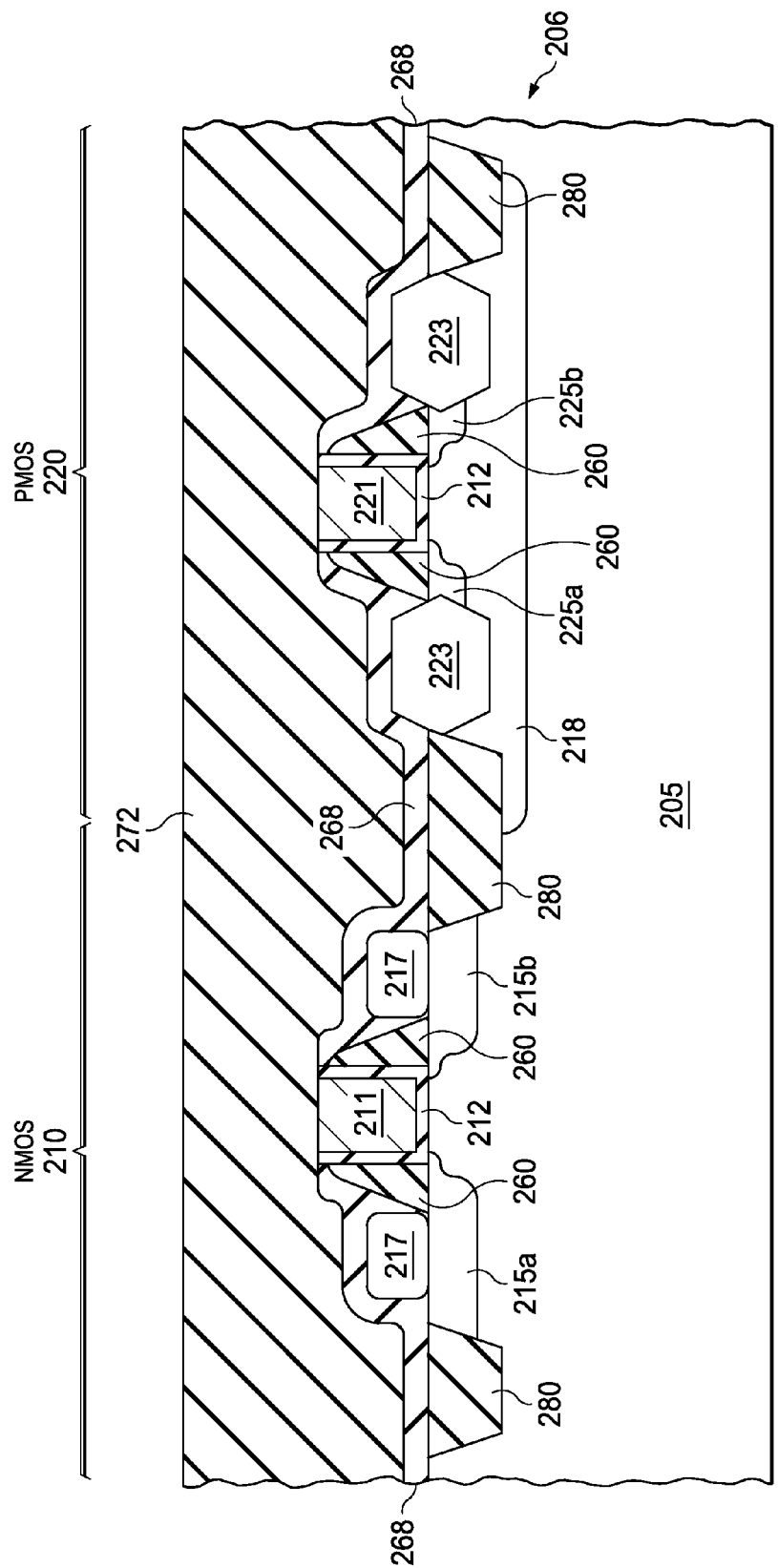
FIGS. 2A-2D are cross-sectional diagrams showing processing progression for an example method of forming an integrated circuit (IC) having disclosed metal gate MOS transistors having dielectric liners, according to an example embodiment.

FIG. 2A is a cross-sectional diagram showing processing progression for portion of an IC after planarization of the PMD for an example replacement metal gate process with optional stressors on an example p-type substrate 205 having a p-type top semiconductor surface 206. Nwell 218 is formed on top semiconductor surface 206. The NMOS transistor is shown as NMOS 210 and the PMOS transistor as PMOS 220 shown formed in the nwell 218. Although the process progression shows only a single NMOS transistor and a single and PMOS transistor, in a typical CMOS process there are a plurality of both high voltage gate (HVG) transistors (e.g., 3.3 volt devices), and a plurality of low voltage transistors (e.g., 1 volt devices).

In one embodiment, the substrate 205 comprises a bulk silicon substrate, such as a lightly doped p-type or n-type substrate. Other types of substrates 205, such as silicon on insulator (SOI), silicon carbide, gallium nitride, gallium arsenide or SiGe can also be used, as well as substrates 205 with a different top semiconductor surface 206, such as SiGe on silicon.

Electrical isolation between devices is shown provided by shallow trench isolations (STIs) 280 shown. However, any conventional isolation structure may generally be used such as field oxidation regions (also known as (LOCal Oxidation of Silicon (LOCOS) regions) or implanted isolation regions.

NMOS 210 comprises gate electrode stack on the semiconductor surface 206 including a metal gate electrode 211 on a Hi-k gate dielectric 212. Alternatively, the gate electrode can comprise polysilicon and the gate dielectric a thermal oxide or a nitrided thermal oxide (see FIG. 3 below). NMOS 210 includes source 215a and drain 215b located adjacent to the gate stack 211/212 in the semiconductor surface 206. The source/drain 215a and 215b for NMOS 210 are heavily doped with n-type dopants and generally include the LDD extensions shown. The doped regions can be formed by ion implantation. NMOS 210 also includes raised source/drain regions 217 which in one particular embodiment can be carbon doped (e.g., SiC).

PMOS 220 comprises gate electrode stack on the nwell 218 including a metal gate electrode 221 on a Hi-k gate dielectric 212. Although not shown, a barrier metal general on the Hi-k gate dielectric 212 frames the metal gate electrode 221. As used herein, a Hi-k dielectric material refers to a dielectric material having a high relative dielectric constant κ as compared to silicon dioxide which has a κ value of about 3.9. Typical Hi-k dielectrics provide κ values of at least 5. Although NMOS 210 and PMOS 220 are shown having the same Hi-k gate dielectric 212, they can have different Hi-k materials. PMOS 220 includes source 225a and drain 225b located adjacent to the gate stack 221/212 in the nwell 218. The source/drain 225a and 225b are heavily doped with p-type dopants and generally include the LDD extensions shown. The doped regions can be formed by ion implantation. PMOS 220 also includes embedded source/drain regions 223, such as comprising SiGe.

Spacers 260 are on the sidewalls of the respective gate stacks 211/212 and 221/212. The spacers 260 generally comprise at least one dielectric material. Alternatively, the spacers 260 are removed after formation of source/drain 215a and 215b for NMOS 210, source/drain 225a and 225b for PMOS 220, raised source/drain regions 217 for NMOS 210 and embedded source/drain regions 223 for PMOS 220. Contact etch stop layer (CESL) 268 is shown with PMD 272 being on the CESL 268. CESL 268 may comprise SiN while PMD may comprise silicon oxide in one particular embodiment.

Figure 2B:
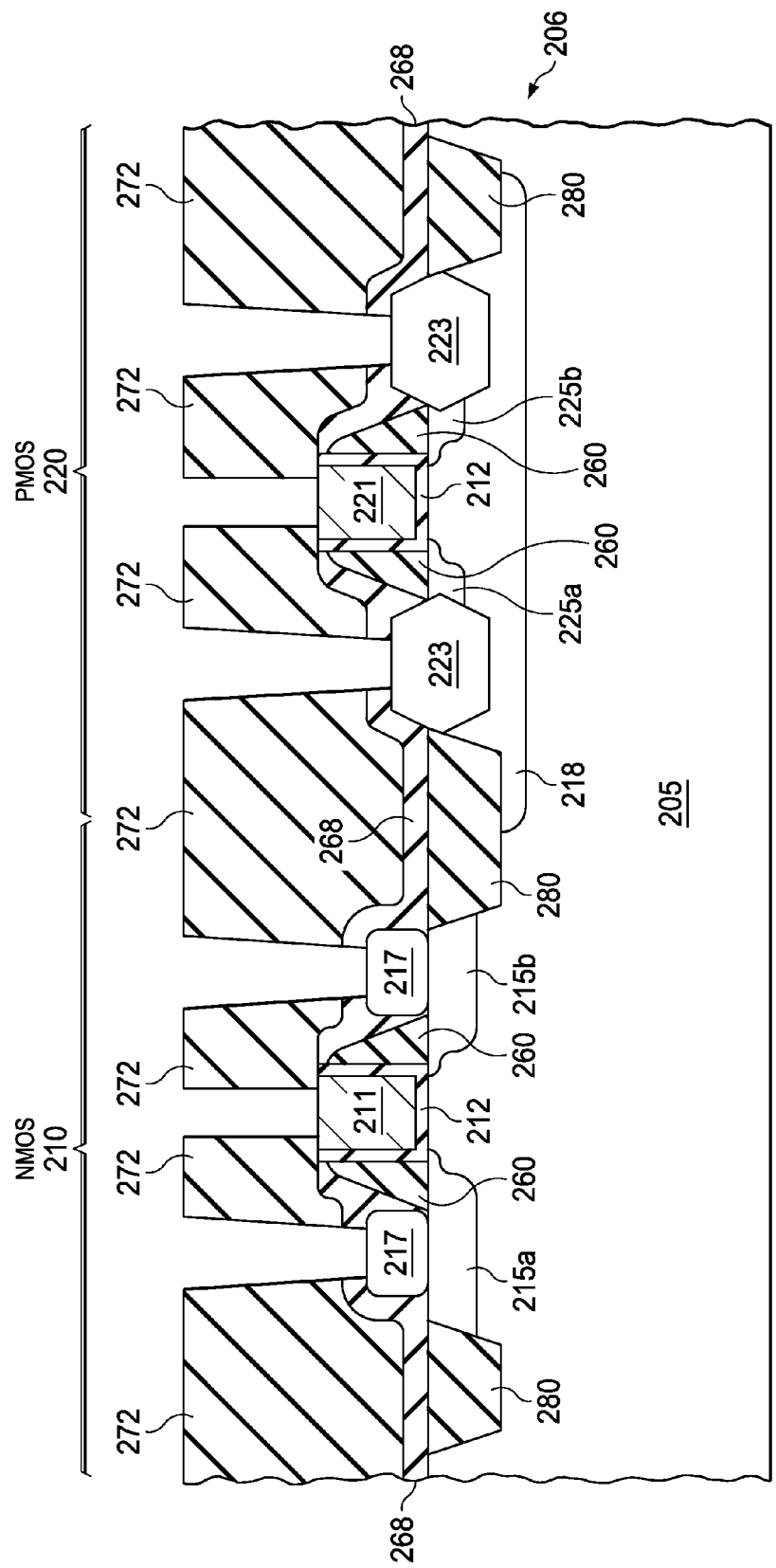

Step 102 comprises forming contact holes though the PMD 272 and CESL 268 to form a contact to the gate electrodes and contacts to the source and drain regions. A lithography and etch process is generally used for forming the contact holes. At about the 20 nm node CMOS and beyond, the contact hole is generally patterned by double patterning method, with one lithography step for source/drain contact and another lithography step for gate contact. The contact holes allow making electrical contact to the device contacts including to gates, sources and drains for the transistors, and optionally the body. FIG. 2B is a cross-sectional diagrams showing processing progression for a portion of an IC after forming the contact holes.

Figure 2C:
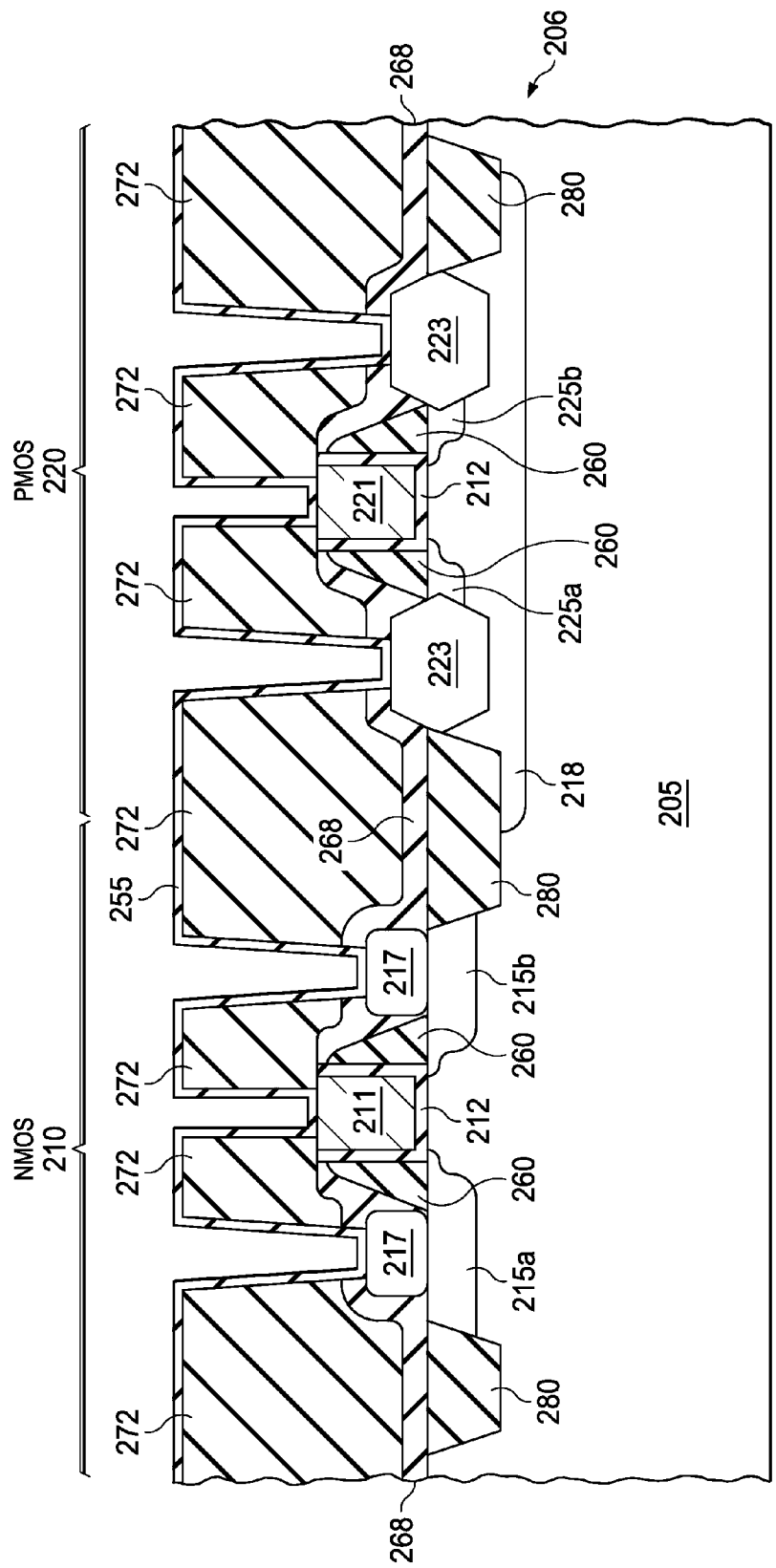

Step 103 comprises depositing a post contact etch dielectric layer. The post contact etch dielectric layer is generally blanket deposited and is thus deposited on the contacts to the gate electrode, contacts to the source and drain, and on the sidewalls of the PMD 272 and CESL 268. FIG. 2C is a cross-sectional diagrams showing processing progression for portion of an IC after depositing the post contact etch dielectric layer shown as 255. The post contact etch dielectric layer 255 can be deposited by example methods including chemical vapor deposition (CVD), atomic layer deposition (ALD), plasma enhanced CVD (PECVD), and atmospheric pressure chemical vapor deposition (APCVD).

The post contact etch dielectric layer 255 can comprise dielectric layers such as SiN, SiON, SiC or SiCN. The thickness for the post contact etch dielectric layer is generally from 1 nm to 10 nm, but can be thicker or thinner than this range.

Step 104 comprises selectively removing the post contact etch dielectric layer 255 from the contacts to the gate electrodes and contacts to the sources and drains, while leaving at least a portion of the post contact etch dielectric layer on the sidewalls of the PMD 272 and CESL 268 to provide a dielectric liner 255'. An anisotropic etch such as an argon (Ar) sputter pre-clean or reactive ion etch (RIE) can be used for selectively removing the post contact etch dielectric layer 255 from the bottom of these contacts.

A pre-silicide clean is then performed. The pre-silicide clean, for example, can comprise wet cleaning using a dilute HF aqueous solution or can comprise dry cleaning using a plasma (e.g., a $NF_3/NH_3$ plasma) or can comprise a combination of both the above. Other clean chemistries or processes are can also be used. The pre-silicide clean prepares the surfaces for metal deposition by removing any thin "native" oxide on the gate (for silicon gate embodiments) and on the source/drain regions. During the pre-silicide clean the disclosed dielectric liner 255' on the sidewalls of the contact holes over the PMD 272 and CESL 268 protects the contact hole sidewall to avoid increasing contact hole CD that can occur for typical silicide pre-cleans such as dilute HF or $NF_3/NH_3$ plasma that generally have a high silicon dioxide etch rate and relatively low SiN, SiON, SiC, or SiCN etch rates.

Figure 2D:
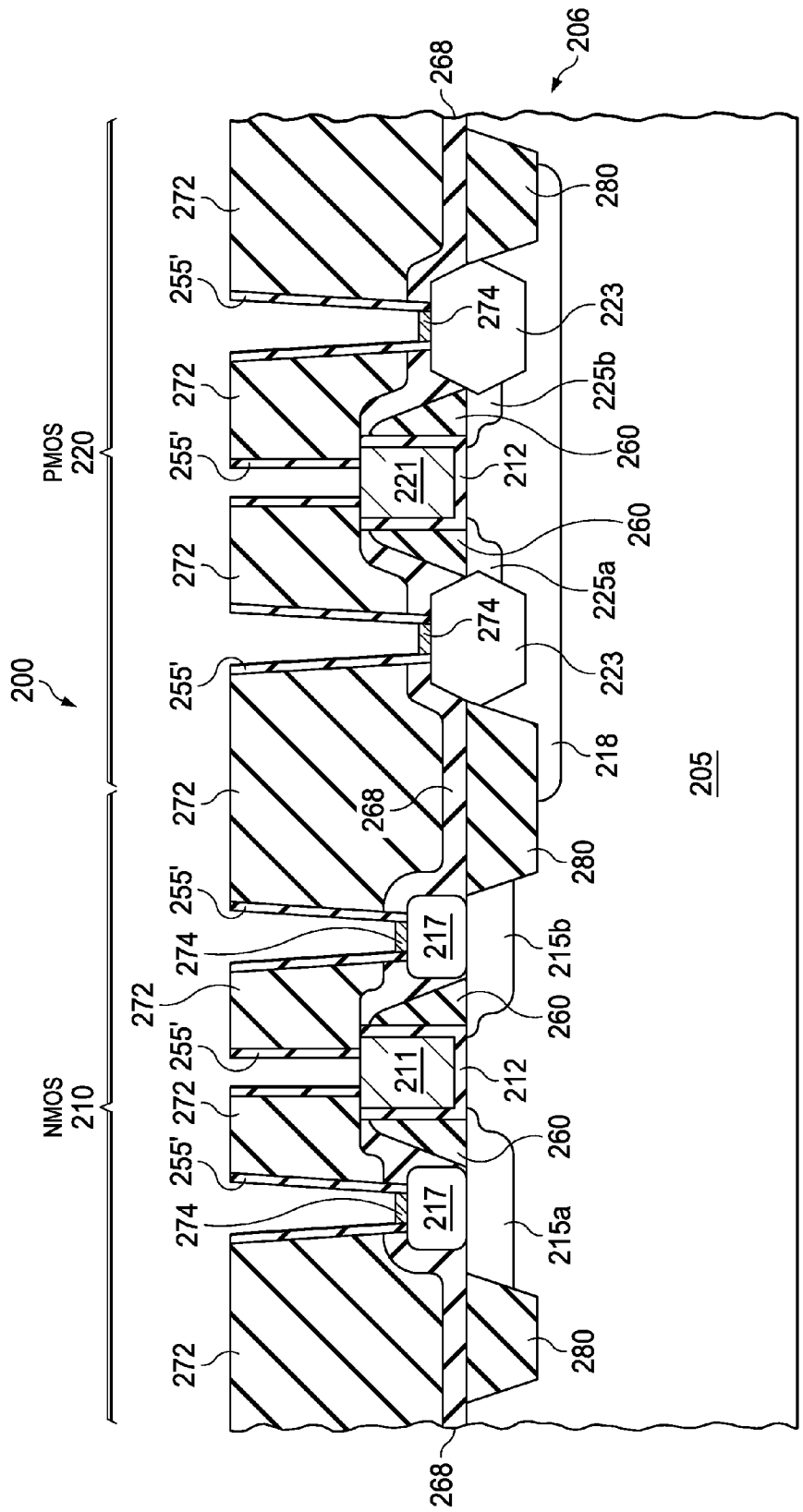

Step 105 comprises forming a metal silicide layer on the contacts to the gate electrode and the contacts to the source and drain regions. The metal silicide layer can comprise various metal or metal alloys including nickel, platinum, cobalt, titanium, gold, or a nickel alloy. FIG. 2D is a cross-sectional diagrams showing processing progression for portion of an IC now labeled as 200 showing a metal silicide layer 274 on the contacts to the sources and drains, and a dielectric liner 255' on sidewalls of the contact holes. Metallization and passivation are not shown for simplicity.

A salicide process to form the metal silicide layer 274 can be performed to form metal silicide contacts over the source, drain and the gate electrodes for polysilicon gate electrodes. In one embodiment, the salicide process forms nickel alloy silicide contacts. The salicide process, for example, can comprise annealing the substrate, causing a reaction between the metal and silicon (e.g., substrate, epi and polysilicon). Typically, the salicide process comprises rapid thermal annealing (RTA). Unreacted metal and cap material may be removed, for example, by wet cleaning (e.g., sulfuric peroxide mixture (SPM) or an ammonium peroxide mixture (APM)).

The method continues by forming interconnections to the contacts of the transistors NMOS 210 and PMOS 220 including the silicided contacts, such as tungsten for filling the contact holes, followed by depositing an electrically conductive metal material, such as copper. For example, thereafter, a dielectric layer may be deposited and patterned to create vias and trenches. The vias and trenches are then filled with electrically conductive material, such as copper, to form metal interconnects. Further processes are performed to complete the IC, for example, additional interconnect levels, passivation, until the final structure of the IC is completed. Dicing and packaging generally follows.

Figure 3:
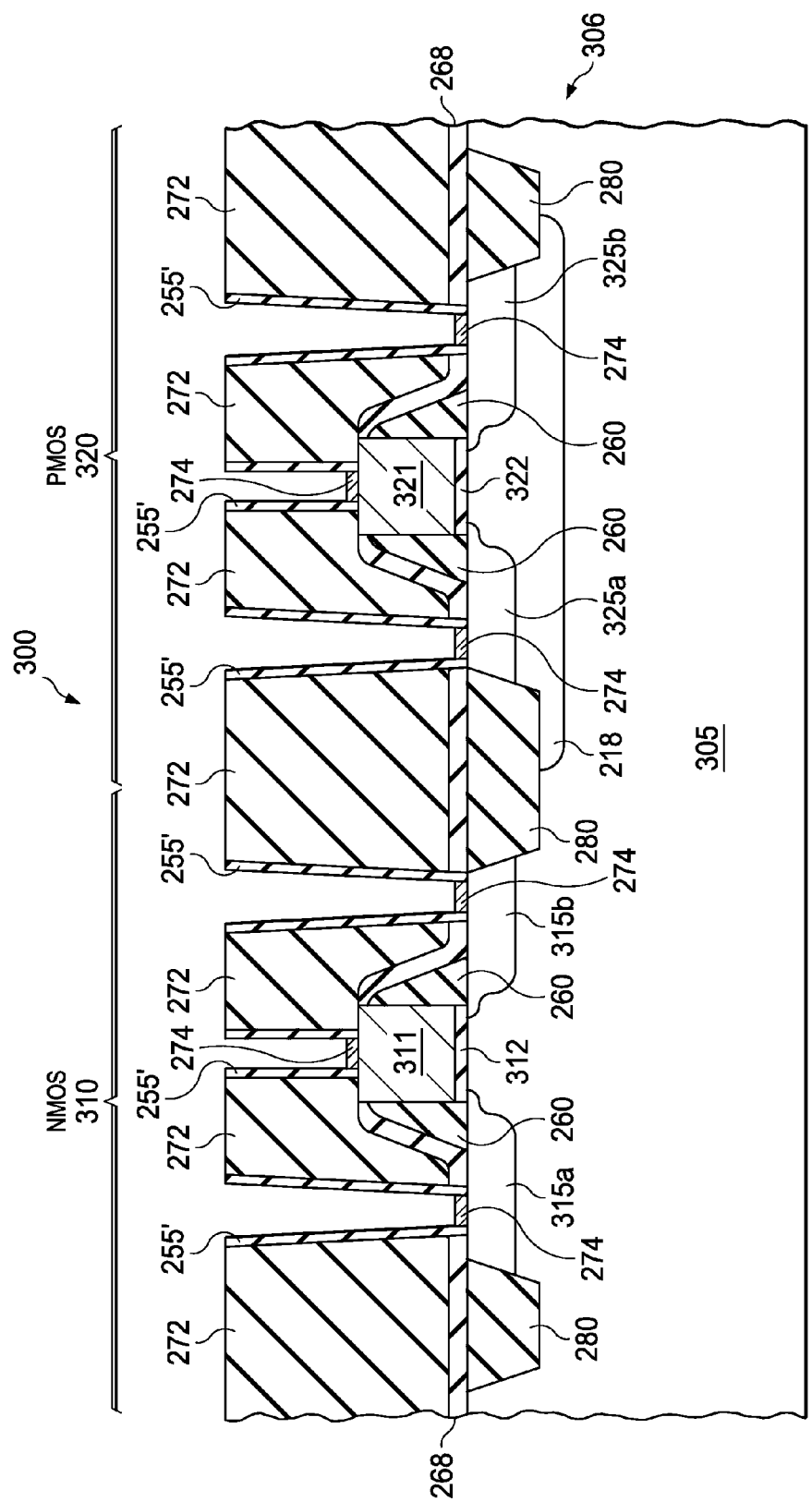
FIG. 3 is a cross sectional view of an IC having disclosed polysilicon gate MOS transistors having dielectric liners, according to an example embodiment.

FIG. 3 shows a portion of an IC 300 in accordance with an example embodiment including a polysilicon gate NMOS transistor 310 and a polysilicon gate PMOS transistor 320 in a top semiconductor surface 306 of the substrate 305. A dielectric liner 255' is on the sidewalls of the various contact holes. Metallization and passivation are not shown for simplicity. Dielectric isolation is provided by the STIs 280 shown. The contacts to the gate electrode 311, source 315*a* and drain 315*b* for NMOS transistor 310 and contacts to the gate electrode 321, source 325*a* and drain 325*b* for PMOS transistor 320 include a metal silicide layer 274 thereon. NMOS transistor 310 includes gate dielectric 312 and PMOS transistor 320 includes gate dielectric 322, which can be the same or different dielectric materials.

Disclosed embodiments can be used to form semiconductor die that may integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An integrated circuit (IC), comprising:
    a substrate having a semiconductor surface,
        a plurality of Metal-Oxide Semiconductor (MOS) transistors formed in said semiconductor surface including an NMOS transistor and a PMOS transistor each including a source, and a drain at least partially in said semiconductor surface, and a gate electrode on a gate dielectric on said semiconductor surface, dielectric spacers on sidewalls of said gate electrode, and a pre-metal dielectric (PMD) layer over said gate electrode and over said source and said drain;
        contact holes through said PMD layer to provide contacts to said gate electrode, said source and said drain for said NMOS and said PMOS transistor;
        a dielectric liner on sidewalls of said contact holes, and
        a metal silicide layer in each of the contact holes extending between the dielectric liner on the sidewalls.

2. The IC of claim 1, wherein said dielectric liner comprises silicon nitride (SiN) or silicon oxynitride (SiON), silicon carbide (SiC), or silicon carbide nitride (SiCN).

3. The IC of claim 1, wherein a thickness of said dielectric liner is from 1 nm to 10 nm.

4. The IC of claim 1, wherein said gate electrode for said NMOS transistor and said PMOS transistor both comprise a metal gate, and wherein said gate dielectric for said NMOS transistor and said PMOS transistor both comprise a Hi-k dielectric.

5. The IC of claim 1, wherein said metal silicide layer comprises a nickel, platinum, cobalt, titanium, gold, or a nickel alloy.

6. The IC of claim 1, wherein said gate electrode for said NMOS transistor and said PMOS transistor both comprise a polysilicon gate.

7. An integrated circuit (IC), comprising:
a substrate having a semiconductor surface;
a Metal-Oxide Semiconductor (MOS) transistor formed in said semiconductor surface including a source, a drain, a gate electrode on a gate dielectric on said semiconductor surface, and dielectric spacers on sidewalls of said gate electrode;
a pre-metal dielectric (PMD) layer over said gate electrode and over said source and said drain;
a first contact extending through said PMD layer to said source and a second contact extending through said PMD layer to said drain, wherein the first contact and the second contact each include a dielectric liner on sidewalls thereof and wherein the first contact includes a first metal silicide layer at the bottom of the first contact extending over the source only between the dielectric liner on the sidewalls of the first contact, and the second contact includes a second metal silicide layer at the bottom of the second contact extending over the drain only between the dielectric liner on the sidewalls of the second contact.

8. The IC of claim 7, wherein said dielectric liner comprises silicon nitride (SiN) or silicon oxynitride (SiON), silicon carbide (SiC), or silicon carbide nitride (SiCN).

9. The IC of claim 7, wherein a thickness of said dielectric liner is from 1 nm to 10 nm.

10. The IC of claim 7, wherein said gate electrode comprises a metal gate, and wherein said gate dielectric comprises a Hi-k dielectric.

11. The IC of claim 7, wherein said first and said second metal silicide layers comprise nickel, platinum, cobalt, titanium, gold, or a nickel alloy.

12. The IC of claim 1, wherein said gate electrode comprises a polysilicon gate.

13. The IC of claim 1, further comprising a third contact extending through the PMD layer to the gate electrode, wherein the third contact also includes the dielectric liner on sidewalls thereof and wherein the third contact includes a third metal silicide layer at the bottom of the third contact extending over the gate electrode only between the dielectric liner on the sidewalls of the third contact.

14. The IC of claim 13, wherein said dielectric liner comprises silicon nitride (SiN) or silicon oxynitride (SiON), silicon carbide (SiC), or silicon carbide nitride (SiCN).

15. The IC of claim 13, wherein a thickness of said dielectric liner is from 1 nm to 10 nm.

16. The IC of claim 13, wherein said gate electrode comprises a metal gate, and wherein said gate dielectric comprises a Hi-k dielectric.

17. The IC of claim 13, wherein said first, said second, and said third metal silicide layers comprise nickel, platinum, cobalt, titanium, gold, or a nickel alloy.

* * * * *